United States Patent
Wang et al.

(10) Patent No.: US 12,532,566 B2
(45) Date of Patent: Jan. 20, 2026

(54) EPITAXIAL STRUCTURE OF NONPOLAR AlGaN-BASED DEEP-ULTRAVIOLET (DUV) PHOTOELECTRIC DETECTOR AND PREPARATION METHOD THEREOF

(71) Applicant: SOUTH CHINA UNIVERSITY OF TECHNOLOGY, Guangzhou (CN)

(72) Inventors: Wenliang Wang, Guangzhou (CN); Jianhua Duan, Guangzhou (CN); Guoqiang Li, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 404 days.

(21) Appl. No.: 18/276,667

(22) PCT Filed: Sep. 27, 2022

(86) PCT No.: PCT/CN2022/121833
§ 371 (c)(1),
(2) Date: Aug. 10, 2023

(87) PCT Pub. No.: WO2023/193409
PCT Pub. Date: Oct. 12, 2023

(65) Prior Publication Data
US 2025/0022973 A1  Jan. 16, 2025

(30) Foreign Application Priority Data
Apr. 8, 2022 (CN) .......................... 202210363310.4

(51) Int. Cl.
*H10F 77/124* (2025.01)
*H10F 30/10* (2025.01)
(Continued)

(52) U.S. Cl.
CPC ....... *H10F 77/12485* (2025.01); *H10F 30/10* (2025.01); *H10F 71/1274* (2025.01);
(Continued)

(58) Field of Classification Search
CPC ............. H01L 31/1848; H01L 31/1852; H01L 31/1035; H01L 31/036; H01L 31/035272;
(Continued)

(56) References Cited

U.S. PATENT DOCUMENTS 10,340,416 B2 * 7/2019 Jo .......................... H10H 20/82
12,126,143 B2 * 10/2024 McLaurin ............... H01S 5/222
(Continued)

FOREIGN PATENT DOCUMENTS

CN  101538740 A   9/2009
CN  102280370 A   12/2011
(Continued)

OTHER PUBLICATIONS

Yen-Teng Ho, et al., Non-polar a-plane GaN grown on LaAlO3 (0 0 1) substrate by pulsed laser deposition, Journal of Crystal Growth, 2008, pp. 1614-1618, vol. 310.

*Primary Examiner* — Earl N Taylor
(74) *Attorney, Agent, or Firm* — Bayramoglu Law Offices LLC

(57) ABSTRACT

An epitaxial structure of a nonpolar AlGaN-based deep-ultraviolet (DUV) photoelectric detector and a preparation method thereof are provided. The epitaxial structure of the nonpolar AlGaN-based DUV photoelectric detector includes a nonpolar AlN buffer layer, a nonpolar $Al_{0.15}Ga_{0.85}N$ buffer layer, and a nonpolar $Al_{0.7}Ga_{0.3}N$ epitaxial layer that are sequentially grown on a $LaAlO_3$ substrate. The $LaAlO_3$ substrate takes a (100) plane as an epitaxial plane, and AlN[11-20] as an epitaxial growth direction. With the $LaAlO_3$ substrate, the epitaxial structure reduces dislocations and stresses between the substrate and the epitaxial buffer layer. By designing two AlGaN epitaxial buffer layers with different components, the epitaxial structure reduces a dislocation density and a surface roughness of the nonpolar AlGaN epitaxial layer, further accelerates photoresponse (Continued)

and detectivity of the detector, and enhances overall performance of the nonpolar AlGaN-based DUV photoelectric detector.

10 Claims, 2 Drawing Sheets

(51) Int. Cl.
  *H10F 71/00* (2025.01)
  *H10F 77/169* (2025.01)
(52) U.S. Cl.
  CPC ....... *H10F 71/1276* (2025.01); *H10F 71/128* (2025.01); *H10F 77/169* (2025.01)
(58) Field of Classification Search
  CPC ......... H01L 31/03078; H10F 77/12485; H10F 30/10; H10F 71/1274; H10F 71/1276; H10F 71/128; H10F 77/169; H10F 77/14; H10F 77/16; H10F 30/2215; Y02P 70/50; C30B 23/025; C30B 23/063; C30B 29/403
  See application file for complete search history.

(56) References Cited

U.S. PATENT DOCUMENTS

| | | | | |
|---|---|---|---|---|
| 2010/0193843 | A1* | 8/2010 | Lee | .............. H01L 21/02505 |
| | | | | 257/E29.091 |
| 2012/0175739 | A1* | 7/2012 | Hirai | .................. H10F 77/16 |
| | | | | 257/E29.089 |
| 2017/0250308 | A1* | 8/2017 | Jo | ................ H10H 20/01335 |
| 2021/0273415 | A1* | 9/2021 | McLaurin | ............. H01S 5/0213 |
| 2024/0355952 | A1* | 10/2024 | Wang | .................... H10F 77/20 |

FOREIGN PATENT DOCUMENTS

| | | | | | |
|---|---|---|---|---|---|
| CN | 106498395 | A | * | 3/2017 | ......... C23C 14/0036 |
| CN | 108231924 | A | | 6/2018 | |
| CN | 114899258 | A | | 8/2022 | |
| JP | 5294167 | B2 | * | 9/2013 | |
| JP | 2017154964 | A | * | 9/2017 | |
| RU | 2643176 | C1 | * | 1/2018 | ........... H10H 20/812 |

* cited by examiner

EPITAXIAL STRUCTURE OF NONPOLAR AlGaN-BASED DEEP-ULTRAVIOLET (DUV) PHOTOELECTRIC DETECTOR AND PREPARATION METHOD THEREOF

CROSS REFERENCE TO THE RELATED APPLICATIONS

This application is the national phase entry of International Application No. PCT/CN2022/121833, filed on Sep. 27, 2022, which is based upon and claims priority to Chinese Patent Application No. 202210363310.4, filed on Apr. 8, 2022, the entire contents of which are incorporated herein by reference.

TECHNICAL FIELD

The present disclosure relates to the technical field of photoelectric detectors, and in particular, to an epitaxial structure of a nonpolar AlGaN-based deep-ultraviolet (DUV) photoelectric detector and a preparation method thereof.

BACKGROUND

As a third-generation semiconductor material, the AlGaN material features a wide band gap, a strong radiation resistance, a high saturated electron drift velocity, and a high thermal stability, and has been widely applied to high-performance photoelectric devices. With an adjustable band gap capable of covering UV light from 200 nm to 365 nm, the AlGaN material is desirable to prepare a DUV photoelectric detector.

Compared with a conventional polar C-plane AlGaN material, the nonpolar plane AlGaN material is not susceptible to spontaneous polarization, does not cause a quantum-confined Stark effect, and is optically anisotropic. Therefore, the nonpolar plane AlGaN-based device has a higher stability and a better application potential than a polar plane AlGaN-based device. Due to serious lattice mismatch with a substrate, the existing heteroepitaxially grown nonpolar plane AlGaN material has a poor crystalline quality, a rough surface, a high dislocation density, etc., which seriously restricts the performance of the nonpolar plane AlGaN-based device. Hence, to achieve better performance of the detector, it is of great significance to research a high-quality nonpolar AlGaN material.

SUMMARY

The present disclosure provides an epitaxial structure of a nonpolar AlGaN-based DUV photoelectric detector and a preparation method thereof, to solve shortages of the prior art. With the $LaAlO_3$ substrate, the present disclosure reduces dislocations and stresses between the substrate and the epitaxial buffer layer, and improves photoresponse of the DUV photoelectric detector. By designing two AlGaN epitaxial buffer layers with different components, the present disclosure relieves chemical incompatibility between the epitaxial layer and the substrate, reduces a dislocation density and a surface roughness of the nonpolar AlGaN epitaxial layer, and enhances performance of the nonpolar AlGaN-based DUV photoelectric detector. Since the $LaAlO_3$ material is unstable at a high temperature, the present disclosure uses pulsed laser deposition (PLD), and ablates a target material with laser. The present disclosure can grow an epitaxial material at a low temperature to suppress interfacial reaction between the $LaAlO_3$ substrate and the AlGaN material, and thus the prepared nonpolar AlGaN-based DUV photoelectric detector has fast response and high sensitivity.

A first objective of the present disclosure is to provide an epitaxial structure of a nonpolar AlGaN-based DUV photoelectric detector.

A second objective of the present disclosure is to provide a preparation method of an epitaxial structure of a nonpolar AlGaN-based DUV photoelectric detector.

The first objective of the present disclosure may be achieved through the following technical solutions:

An epitaxial structure of a nonpolar AlGaN-based DUV photoelectric detector includes a $LaAlO_3$ substrate, where a nonpolar AlN buffer layer, a nonpolar $Al_{0.15}Ga_{0.85}N$ buffer layer, and a nonpolar $Al_{0.7}Ga_{0.3}N$ epitaxial layer are sequentially grown on the $LaAlO_3$ substrate; and the $LaAlO_3$ substrate takes a (100) plane as an epitaxial plane, and AlN[11-20] as an epitaxial growth direction.

Further, the nonpolar AlN buffer layer has a thickness of 300 nm to 400 nm.

Further, the nonpolar $Al_{0.15}Ga_{0.85}N$ buffer layer has a thickness of 350 nm to 400 nm.

Further, the nonpolar $Al_{0.7}Ga_{0.3}N$ epitaxial layer has a thickness of 450 nm to 550 nm.

The second objective of the present disclosure may be achieved through the following technical solutions:

A preparation method of an epitaxial structure of a nonpolar AlGaN-based DUV photoelectric detector includes:

selecting a $LaAlO_3$ substrate, and cleaning a surface of the $LaAlO_3$ substrate;

putting the cleaned $LaAlO_3$ substrate into an ultrahigh vacuum (UHV) chamber, and annealing the cleaned $LaAlO_3$ substrate at a high temperature to remove surface contamination;

charging nitrogen to the UHV chamber, and epitaxially growing a nonpolar AlN buffer layer on the $LaAlO_3$ substrate by PLD;

changing a target material in an environment of growing the nonpolar AlN buffer layer, and growing a nonpolar $Al_{0.15}Ga_{0.85}N$ buffer layer on the nonpolar AlN buffer layer in-situ; and changing the target material in the environment of growing the nonpolar AlN buffer layer, and growing a nonpolar $Al_{0.7}Ga_{0.3}N$ epitaxial layer on the nonpolar $Al_{0.15}Ga_{0.85}N$ buffer layer.

The $LaAlO_3$ substrate takes a (100) plane as an epitaxial plane, and AlN[11-20] as an epitaxial growth direction.

Further, the environment of growing the nonpolar AlN buffer layer is specifically as follows:

by keeping a vacuum degree in the UHV chamber, a laser energy at 220 mJ to 300 mJ, a laser frequency at 15 Hz to 30 Hz, a nitrogen flow at 2 sccm to 8 sccm, and a nitrogen pressure in the vacuum chamber at 6 mTorr to 10 mTorr, the nonpolar AlN buffer layer is grown in an N-rich atmosphere.

Further, the nonpolar AlN buffer layer is epitaxially grown on the $LaAlO_3$ substrate, and an Al source is an AlN high-purity ceramic target material.

Further, the nonpolar $Al_{0.15}Ga_{0.85}N$ buffer layer is grown on the nonpolar AlN buffer layer in-situ, and the target material is gallium-rich AlGaN ceramic.

Further, the nonpolar $Al_{0.7}Ga_{0.3}N$ epitaxial layer is grown on the $Al_{0.15}Ga_{0.85}N$ buffer layer, and the target material is aluminum-rich AlGaN ceramic.

Further, the nonpolar AlN buffer layer has a thickness of 300 nm to 400 nm;

the nonpolar $Al_{0.15}Ga_{0.85}N$ buffer layer has a thickness of 350 nm to 400 nm; and the nonpolar $Al_{0.7}Ga_{0.3}N$ epitaxial layer has a thickness of 450 nm to 550 nm.

Compared with the prior art, the present disclosure has the following beneficial effects:

1. The lattice mismatch between the (110)-plane $LaAlO_3$ substrate and the (11-20) plane of the nonpolar AlN material is small and is only 0.4% (theoretical value), so the epitaxial structure of a nonpolar AlGaN-based DUV photoelectric detector provided by the present disclosure is a perfect heteroepitaxial substrate material. It can effectively reduce dislocations and stresses between the substrate and the epitaxial buffer layer, improve a crystalline quality of the grown material, enhance a detectivity of the AlGaN-based DUV photoelectric detector, reduce a dark current of the detector, and accelerate photoresponse of the DUV photoelectric detector.

2. The present disclosure grows the epitaxial structure of the nonpolar AlGaN-based DUV photoelectric detector by low-temperature PLD, thereby effectively suppressing interfacial reaction between the substrate and the epitaxial layer at a high temperature, and ensuring growth of the high-quality nonpolar AlGaN-based epitaxial thin film. If the thin film is grown by conventional metal organic chemical vapor deposition (MOCVD) and the like at the high temperature, since the $LaAlO_3$ material is unstable at the high temperature, oxygen atoms separated out from the $LaAlO_3$ substrate react with the epitaxial material to form an interfacial reaction layer with a high density of dislocation defects, thus seriously affecting the crystalline quality. By designing two AlGaN epitaxial buffer layers with different components, the present disclosure relieves chemical incompatibility between the epitaxial layer and the substrate, and gradually releases tensile stresses. This further reduces a dislocation density and a surface roughness of the nonpolar AlGaN epitaxial layer, reduces the dark current of the detector, accelerates the photoresponse and detectivity, and enhances overall performance of the nonpolar AlGaN-based DUV photoelectric detector.

3. The present disclosure employs the nonpolar AlGaN material as a basic material of the device. Compared with a polar AlGaN material, the nonpolar AlGaN material is not susceptible to spontaneous polarization and a built-in electric field, thereby effectively improving the photoresponse of the DUV photoelectric detector. Meanwhile, the nonpolar AlGaN material is optically anisotropic and polarization-sensitive, such that the DUV photoelectric detector is able to detect polarized light.

BRIEF DESCRIPTION OF THE DRAWINGS

To describe the technical solutions in the embodiments of the present disclosure or in the prior art more clearly, the following briefly describes the drawings required for describing the embodiments or the prior art. Apparently, the drawings in the following description show some embodiments of the present disclosure, and those of ordinary skill in the art may still derive other drawings from these drawings without creative efforts.

In FIG. 1:
1—$LaAlO_3$ substrate, 2—nonpolar AlN buffer layer, 3—nonpolar $Al_{0.15}Ga_{0.85}N$ buffer layer, and 4—nonpolar $Al_{0.7}Ga_{0.3}N$ epitaxial layer.

DETAILED DESCRIPTION OF THE EMBODIMENTS

Figure 1:
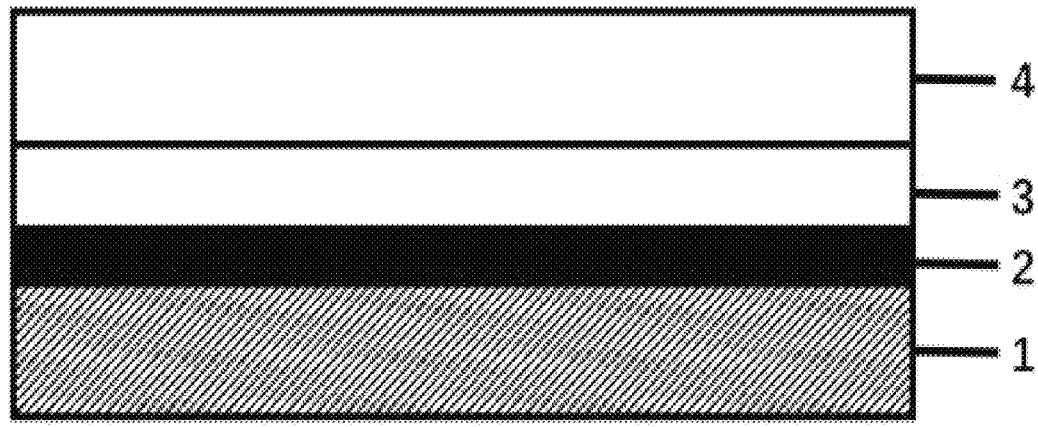
FIG. 1 illustrates a schematic structural view of an epitaxial structure of a nonpolar AlGaN-based DUV photoelectric detector according to an embodiment of the present disclosure.

In order to make objectives, technical solutions and advantages in the embodiments of the present disclosure clearer, the technical solutions in the embodiments of the present disclosure are clearly and completely described below with reference to the accompanying drawings in the embodiments of the present disclosure. Apparently, the described embodiments are merely a part rather than all of the embodiments of the present disclosure. All other embodiments derived from the embodiments in the present disclosure by a person of ordinary skill in the art without creative efforts should fall within the protection scope of the present disclosure. It should be understood that the specific embodiments described herein are merely used to explain the present disclosure, rather than to limit the present disclosure.

An embodiment provides a preparation method of an epitaxial structure of a nonpolar AlGaN-based DUV photoelectric detector, including the following steps:

(1) Selection of a substrate and a crystal orientation: The $LaAlO_3$ substrate takes a (100) plane as an epitaxial plane, and an AlN[11-20] direction as an epitaxial growth direction of a material.

(2) Surface cleaning of the substrate: The $LaAlO_3$ substrate is sequentially put into acetone, anhydrous ethanol and deionized water for ultrasonic cleaning, taken out, washed with the deionized water, and blow-dried with hot high-purity nitrogen.

(3) Surface annealing of the substrate for impurity removal: The $LaAlO_3$ substrate is put into a UHV chamber. By pumping a vacuum degree in the chamber to 2.5*10-10 torr to 2.9*10-10 torr, and heating the chamber to 600° C. to 800° C., the substrate is annealed to remove surface contamination and obtain a flat surface.

(4) Growth of a nonpolar AlN buffer layer: After the substrate is annealed, by cooling the chamber to 450° C., and keeping the vacuum degree in the chamber, a laser energy at 220 mJ to 300 mJ, a laser frequency at 15 Hz to 30 Hz, a nitrogen flow at 2 sccm to 8 sccm, and a nitrogen pressure in the vacuum chamber at 6 mTorr to 10 mTorr, the nonpolar AlN buffer layer is grown by PLD in an N-rich atmosphere. An Al source is an AlN high-purity ceramic target material.

(5) Epitaxial growth of a nonpolar $Al_{0.15}Ga_{0.85}N$ buffer layer: Upon the growth of the nonpolar AlN buffer layer, by keeping the vacuum degree in the chamber, the laser energy, the laser frequency and the nitrogen flow unchanged, and changing a target material into gallium-rich AlGaN ceramic, the nonpolar $Al_{0.15}Ga_{0.85}N$ buffer layer is grown on the nonpolar AlN buffer layer in-situ.

(6) Growth of a nonpolar $Al_{0.7}Ga_{0.3}N$ epitaxial layer: Upon the growth of the nonpolar $Al_{0.15}Ga_{0.85}N$ buffer layer, by keeping the vacuum degree in the chamber, the laser energy, the laser frequency and the nitrogen flow unchanged, and changing the target material into aluminum-rich AlGaN ceramic, the nonpolar $Al_{0.7}Ga_{0.3}N$ epitaxial layer is epitaxially grown on the nonpolar $Al_{0.15}Ga_{0.85}N$ buffer layer.

As shown in FIG. 1, the epitaxial structure of a nonpolar AlGaN-based DUV photoelectric detector prepared in the embodiment includes the nonpolar AlN buffer layer 2, the nonpolar $Al_{0.15}Ga_{0.85}N$ buffer layer 3, and the nonpolar $Al_{0.7}Ga_{0.3}N$ epitaxial layer 4 that are sequentially grown on the $LaAlO_3$ substrate 1. The nonpolar AlN layer has a thickness of 300 nm to 400 nm. The nonpolar $Al_{0.15}Ga_{0.85}N$ buffer layer has a thickness of 350 nm to 400 nm. The nonpolar $Al_{0.7}Ga_{0.3}N$ epitaxial layer has a thickness of 450 nm to 550 nm.

Figure 2:
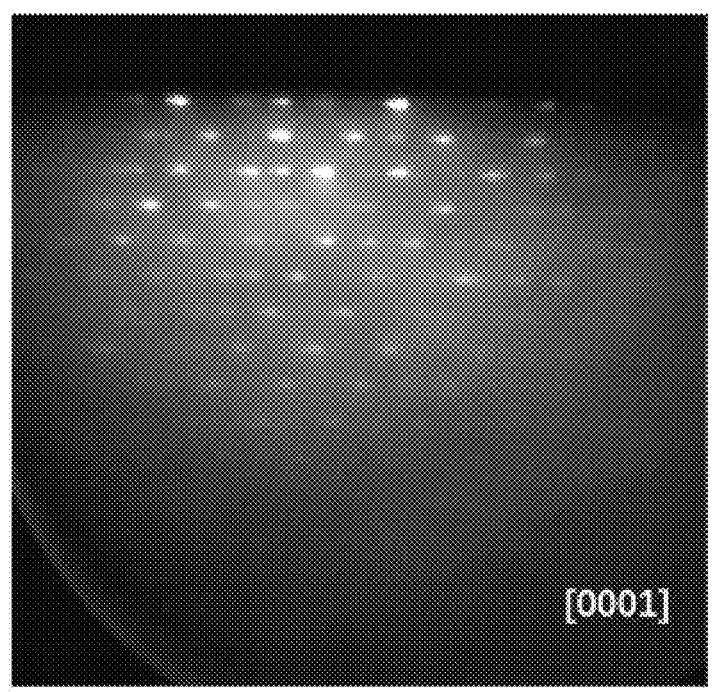
FIG. 2 illustrates a reflection high-energy electron diffraction (RHEED) pattern of a nonpolar AlGaN epitaxial wafer in a direction according to Embodiment 1 of the present disclosure.
Figure 3:
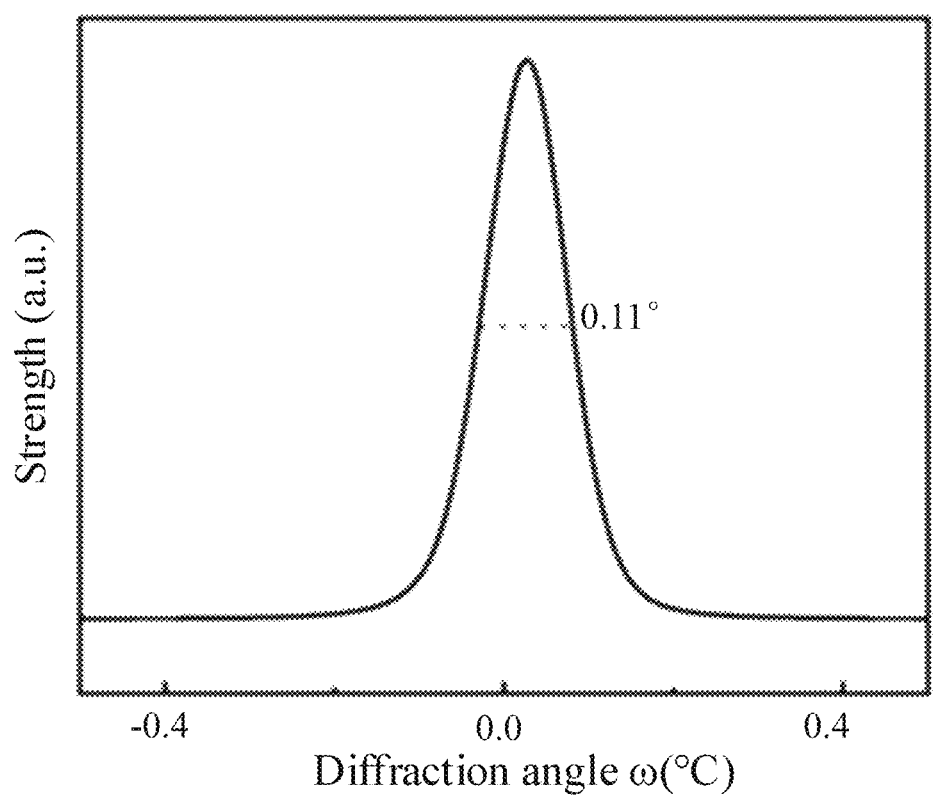
FIG. 3 illustrates a test graph of an X-ray rocking curve of a nonpolar AlGaN(11-20) thin film according to Embodiment 1 of the present disclosure.

The RHEED diffraction pattern for a surface of the nonpolar AlGaN thin film of the grown epitaxial structure in the direction is as shown in FIG. 2. The diffraction pattern shows subtle stripes, which indicates that there are single crystals with a good quality on the surface. The test result of the X-ray rocking curve of the nonpolar AlGaN (11-20) thin film is as shown in FIG. 3. The half-peak width is 0.11°, which indicates that the thin film has a good crystalline quality.

Embodiment 1

The embodiment provides a preparation method of an epitaxial structure of a nonpolar AlGaN-based DUV photoelectric detector, including the following steps:
(1) Selection of a substrate and a crystal orientation: The $LaAlO_3$ substrate takes a (100) close-packed plane as an epitaxial plane, and an AlN[11-20] direction as an epitaxial growth direction of a material.
(2) Surface cleaning of the substrate: The $LaAlO_3$ substrate is sequentially put into acetone, anhydrous ethanol and deionized water to ultrasonically clean for 5 min, taken out, washed with the deionized water, and blow-dried with hot high-purity nitrogen.
(3) Surface annealing of the substrate for impurity removal and leveling: The cleaned $LaAlO_3$ substrate is put into a UHV chamber. By pumping a vacuum degree in the chamber to 2.5*10-10 torr, and heating the chamber to 600° C., the substrate is annealed for 30 min.
(4) Growth of a nonpolar AlN buffer layer: by cooling the chamber to 450° C., keeping a vacuum degree in the chamber at 2.5*10-10 torr, a laser energy at 220 mJ and a laser frequency at 15 Hz, charging a nitrogen flow of 2 sccm, and keeping a nitrogen pressure at 6 mTorr, the AlN nucleating layer is grown by PLD in an N-rich atmosphere. An Al source is an AlN high-purity ceramic target material.
(5) Epitaxial growth of a nonpolar $Al_{0.15}Ga_{0.85}N$ buffer layer: By keeping parameters the same as those in Step (4), and changing a target material into gallium-rich AlGaN ceramic, the nonpolar $Al_{0.15}Ga_{0.85}N$ buffer layer is grown on the nonpolar AlN buffer layer in-situ.
(6) Growth of a nonpolar $Al_{0.7}Ga_{0.3}N$ epitaxial layer: By keeping parameters the same as those in Step (4), and changing the target material into aluminum-rich AlGaN ceramic, the nonpolar $Al_{0.7}Ga_{0.3}N$ buffer layer is grown on the nonpolar $Al_{0.15}Ga_{0.85}N$ buffer layer in-situ.

As shown in FIG. 1, the epitaxial structure of a nonpolar AlGaN-based DUV photoelectric detector prepared in the embodiment includes the nonpolar AlN buffer layer 2, the nonpolar $Al_{0.15}Ga_{0.85}N$ buffer layer 3, and the nonpolar $Al_{0.7}Ga_{0.3}N$ epitaxial layer 4 that are sequentially grown on the $LaAlO_3$ substrate 1. The nonpolar AlN buffer layer has a thickness of 300 nm. The nonpolar $Al_{0.15}Ga_{0.85}N$ buffer layer has a thickness of 360 nm. The nonpolar $Al_{0.7}Ga_{0.3}N$ epitaxial layer has a thickness of 500 nm.

Embodiment 2

The embodiment provides a preparation method of an epitaxial structure of an N-polar-plane AlAlGaN-based DUV photoelectric detector, specifically including the following steps:
(1) Selection of a substrate and a crystal orientation: The $LaAlO_3$ substrate takes a (100) close-packed plane as an epitaxial plane, and an AlN[11-20] direction as an epitaxial growth direction of a material.
(2) Surface cleaning of the substrate: The $LaAlO_3$ substrate is sequentially put into acetone, anhydrous ethanol and deionized water to ultrasonically clean for 5 min, taken out, washed with the deionized water, and blow-dried with hot high-purity nitrogen.
(3) Surface annealing of the substrate for impurity removal and leveling: The cleaned $LaAlO_3$ substrate is put into a UHV chamber. By pumping a vacuum degree in the chamber to 2.5*10-10 torr, and heating the chamber to 700° C., the substrate is annealed for 30 min.
(4) Growth of a nonpolar AlN buffer layer: by cooling the chamber to 450° C., keeping a vacuum degree in the chamber at 2.5*10-10 torr, a laser energy at 280 mJ and a laser frequency at 25 Hz, charging a nitrogen flow of 5 sccm, and keeping a nitrogen pressure at 8 mTorr, a thin film of the AlN nucleating layer is grown by PLD in an N-rich atmosphere. An Al source is an AlN high-purity ceramic target material.
(5) Epitaxial growth of a nonpolar $Al_{0.15}Ga_{0.85}N$ buffer layer: By keeping parameters the same as those in Step (4), and changing a target material into gallium-rich AlGaN ceramic, the nonpolar $Al_{0.15}Ga_{0.85}N$ buffer layer is grown on the nonpolar AlN buffer layer in-situ.
(6) Growth of a nonpolar $Al_{0.7}Ga_{0.3}N$ epitaxial layer: By keeping parameters the same as those in Step (4), and changing the target material into aluminum-rich AlGaN ceramic, the nonpolar $Al_{0.7}Ga_{0.3}N$ buffer layer is grown on the nonpolar $Al_{0.15}Ga_{0.85}N$ buffer layer in-situ.

As shown in FIG. 1, the epitaxial structure of a nonpolar AlGaN-based DUV photoelectric detector prepared in the embodiment includes the nonpolar AlN buffer layer 2, the nonpolar $Al_{0.15}Ga_{0.85}N$ buffer layer 3, and the nonpolar $Al_{0.7}Ga_{0.3}N$ epitaxial layer 4 that are sequentially grown on the $LaAlO_3$ substrate 1. The nonpolar AlN buffer layer has a thickness of 300 nm. The nonpolar $Al_{0.15}Ga_{0.85}N$ buffer layer has a thickness of 360 nm. The nonpolar $Al_{0.7}Ga_{0.3}N$ epitaxial layer has a thickness of 450 nm.

Embodiment 3

The embodiment provides a preparation method of an epitaxial structure of an N-polar-plane AlAlGaN-based DUV photoelectric detector, specifically including the following steps:
(1) Selection of a substrate and a crystal orientation: The $LaAlO_3$ substrate takes a (100) close-packed plane as an epitaxial plane, and an AlN[11-20] direction as an epitaxial growth direction of a material.

(2) Surface cleaning of the substrate: The LaAlO$_3$ substrate is sequentially put into acetone, anhydrous ethanol and deionized water to ultrasonically clean for 5 min, taken out, washed with the deionized water, and blow-dried with hot high-purity nitrogen.

(3) Surface annealing of the substrate for impurity removal and leveling: The cleaned LaAlO$_3$ substrate is put into a UHV chamber. By pumping a vacuum degree in the chamber to 2.5*10-10 torr, and heating the chamber to 800° C., the substrate is annealed for 30 min.

(4) Growth of a nonpolar AlN buffer layer: by cooling the chamber to 450° C., keeping a vacuum degree in the chamber at 2.5*10-10 torr, a laser energy at 300 mJ and a laser frequency at 30 Hz, charging a nitrogen flow of 8 sccm, and keeping a nitrogen pressure at 10 mTorr, a thin film of the AlN nucleating layer is grown by PLD in an N-rich atmosphere. An Al source is an AlN high-purity ceramic target material.

(5) Epitaxial growth of a nonpolar Al$_{0.15}$Ga$_{0.85}$N buffer layer: By keeping parameters the same as those in Step (4), and changing a target material into gallium-rich AlGaN ceramic, the nonpolar Al$_{0.15}$Ga$_{0.85}$N buffer layer is grown on the nonpolar AlN buffer layer in-situ.

(6) Growth of a nonpolar Al$_{0.7}$Ga$_{0.3}$N epitaxial layer: By keeping parameters the same as those in Step (4), and changing the target material into aluminum-rich AlGaN ceramic, the nonpolar Al$_{0.7}$Ga$_{0.3}$N buffer layer is grown on the nonpolar Al$_{0.15}$Ga$_{0.85}$N buffer layer in-situ.

As shown in FIG. 1, the epitaxial structure of a nonpolar AlGaN-based DUV photoelectric detector prepared in the embodiment includes the nonpolar AlN buffer layer 2, the nonpolar Al$_{0.15}$Ga$_{0.85}$N buffer layer 3, and the nonpolar Al$_{0.7}$Ga$_{0.3}$N epitaxial layer 4 that are sequentially grown on the LaAlO$_3$ substrate 1. The nonpolar AlN buffer layer has a thickness of 350 nm. The nonpolar Al$_{0.15}$Ga$_{0.85}$N buffer layer has a thickness of 380 nm. The nonpolar Al$_{0.7}$Ga$_{0.3}$N epitaxial layer has a thickness of 500 nm.

In conclusion, the epitaxial structure of a nonpolar AlGaN-based DUV photoelectric detector provided by the present disclosure includes the nonpolar AlN buffer layer, the nonpolar Al$_{0.15}$Ga$_{0.85}$N buffer layer, and the nonpolar Al$_{0.7}$Ga$_{0.3}$N epitaxial layer that are sequentially grown on the LaAlO$_3$ substrate. The LaAlO$_3$ substrate takes the (100) plane as the epitaxial plane, and the AlN[11-20] as the epitaxial growth direction, so the present disclosure enhances a power and a detectivity of the AlGaN-based DUV photoelectric detector, and improves photoresponse of the DUV photoelectric detector. The epitaxial structure of a nonpolar AlGaN-based DUV photoelectric detector provided by the present disclosure reduces a dislocation density and a surface roughness of the grown nonpolar AlGaN epitaxial layer, reduces the dark current of the detector, accelerates the photoresponse and detectivity, and enhances overall performance of the nonpolar AlGaN-based DUV photoelectric detector.

The above described are merely preferred embodiments of the present disclosure, and the protection scope of the present disclosure is not limited thereto. Any equivalent substitutions or changes made by those skilled in the art according to the technical solutions and concepts of the present disclosure within the technical scope of the present disclosure should fall within the protection scope of the present disclosure.

What is claimed is:

1. An epitaxial structure of a nonpolar AlGaN-based deep-ultraviolet (DUV) photoelectric detector, comprising a LaAlO$_3$ substrate, wherein a nonpolar AlN buffer layer, a nonpolar Al$_{0.15}$Ga$_{0.85}$N buffer layer, and a nonpolar Al$_{0.7}$Ga$_{0.3}$N epitaxial layer are sequentially grown on the LaAlO$_3$ substrate; and the LaAlO$_3$ substrate takes a (100) plane as an epitaxial plane, and AlN[11-20] as an epitaxial growth direction.

2. The epitaxial structure of the nonpolar AlGaN-based DUV photoelectric detector according to claim 1, wherein the nonpolar AlN buffer layer has a thickness of 300 nm to 400 nm.

3. The epitaxial structure of the nonpolar AlGaN-based DUV photoelectric detector according to claim 1, wherein the nonpolar Al$_{0.15}$Ga$_{0.85}$N buffer layer has a thickness of 350 nm to 400 nm.

4. The epitaxial structure of the nonpolar AlGaN-based DUV photoelectric detector according to claim 1, wherein the nonpolar Al$_{0.7}$Ga$_{0.3}$N epitaxial layer has a thickness of 450 nm to 550 nm.

5. A preparation method of an epitaxial structure of a nonpolar AlGaN-based deep-ultraviolet (DUV) photoelectric detector, comprising: selecting a LaAlO$_3$ substrate, and cleaning a surface of the LaAlO$_3$ substrate to obtain a cleaned LaAlO$_3$ substrate;

putting the cleaned LaAlO$_3$ substrate into an ultrahigh vacuum (UHV) chamber, and annealing the cleaned LaAlO$_3$ substrate at a high temperature to remove surface contamination;

charging nitrogen to the UHV chamber, and epitaxially growing a nonpolar AlN buffer layer on the LaAlO$_3$ substrate by pulsed laser deposition (PLD);

changing a target material in an environment of growing the nonpolar AlN buffer layer, and growing a nonpolar Al$_{0.15}$Ga$_{0.85}$N buffer layer on the nonpolar AlN buffer layer in-situ; and changing the target material in the environment of growing the nonpolar AlN buffer layer, and growing a nonpolar Al$_{0.7}$Ga$_{0.3}$N epitaxial layer on the Al$_{0.15}$Ga$_{0.85}$N buffer layer;

wherein the LaAlO$_3$ substrate takes a (100) plane as an epitaxial plane, and AlN[11-20] as an epitaxial growth direction.

6. The preparation method according to claim 5, wherein the environment of growing the nonpolar AlN buffer layer is as follows: by keeping a vacuum degree in the UHV chamber, a laser energy at 220 mJ to 300 mJ, a laser frequency at 15 Hz to 30 Hz, a nitrogen flow at 2 sccm to 8 sccm, and a nitrogen pressure in the UHV chamber at 6 mTorr to 10 mTorr, the nonpolar AlN buffer layer is grown in an N-rich atmosphere.

7. The preparation method according to claim 5, wherein the nonpolar AlN buffer layer is epitaxially grown on the LaAlO$_3$ substrate, and an Al source is an AlN high-purity ceramic target material.

8. The preparation method according to claim 5, wherein the nonpolar Al$_{0.15}$Ga$_{0.85}$N buffer layer is grown on the nonpolar AlN buffer layer in-situ, and the target material is gallium-rich AlGaN ceramic.

9. The preparation method according to claim 5, wherein the nonpolar Al$_{0.7}$Ga$_{0.3}$N epitaxial layer is grown on the Al$_{0.15}$Ga$_{0.85}$N buffer layer, and the target material is aluminum-rich AlGaN ceramic.

10. The preparation method according to claim 5, wherein the nonpolar AlN buffer layer has a thickness of 300 nm to 400 nm;
  the nonpolar $Al_{0.15}Ga_{0.85}N$ buffer layer has a thickness of 350 nm to 400 nm; and
  the nonpolar $Al_{0.7}Ga_{0.3}N$ epitaxial layer has a thickness of 450 nm to 550 nm.

* * * * *